US007830933B2

United States Patent
Funada

(10) Patent No.: US 7,830,933 B2
(45) Date of Patent: Nov. 9, 2010

(54) OPTICAL TRANSMITTER PROVIDING A PLURALITY OF TRANSMITTER UNITS EACH HAVING A THERMO-ELECTRIC COOLER CONNECTED IN SERIES TO EACH OTHER

(75) Inventor: Tomoyuki Funada, Yokohama (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 171 days.

(21) Appl. No.: 12/213,206

(22) Filed: Jun. 16, 2008

(65) Prior Publication Data

US 2009/0086776 A1    Apr. 2, 2009

(30) Foreign Application Priority Data

Jun. 15, 2007    (JP)    ............... P2007-159251

(51) Int. Cl.
*H01S 3/04*    (2006.01)
(52) U.S. Cl. ............... 372/34; 372/38.1; 372/38.08
(58) Field of Classification Search . 372/29.01–29.016, 372/34–38.09
See application file for complete search history.

(56) References Cited

U.S. PATENT DOCUMENTS

| 5,515,682 | A | | 5/1996 | Nagakubo et al. |
| 5,920,583 | A | * | 7/1999 | Chen et al. ............... 372/34 |
| 6,922,423 | B2 | * | 7/2005 | Thornton ............... 372/38.07 |
| 2004/0161248 | A1 | * | 8/2004 | Stewart et al. ............... 398/196 |
| 2007/0171947 | A1 | * | 7/2007 | Bell ............... 372/38.08 |

FOREIGN PATENT DOCUMENTS

JP    10-335724    12/1998

* cited by examiner

*Primary Examiner*—Minsun Harvey
*Assistant Examiner*—Xnning Niu
(74) *Attorney, Agent, or Firm*—Venable LLP; Michael A. Sartori; Justine A. Gozzi

(57) ABSTRACT

An optical transmitter with a plurality of transmitter units each providing a Peltier device is disclosed. The Peltier devices of the invention are connected in series with respect to the driver, accordingly, even when the Peltier devices show a relative low impedance, a total load impedance viewed from the driver becomes a substantial value and the total power consumption of the transmitter may be reduced.

7 Claims, 5 Drawing Sheets

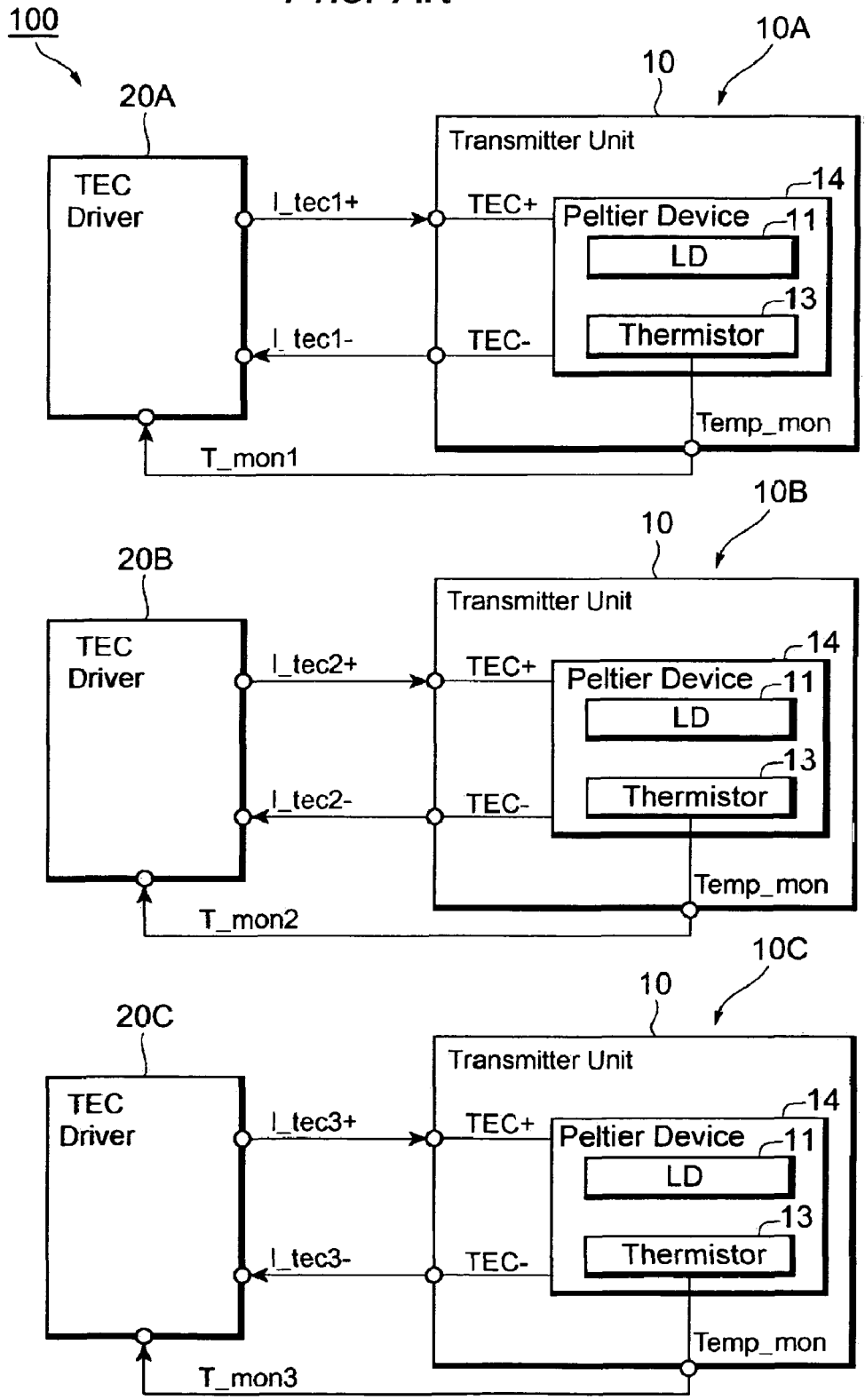
FIG. 5 *Prior Art*

OPTICAL TRANSMITTER PROVIDING A PLURALITY OF TRANSMITTER UNITS EACH HAVING A THERMO-ELECTRIC COOLER CONNECTED IN SERIES TO EACH OTHER

BACKGROUND OF THE INVENTION

1. Field of the Invention

The present invention relates to an optical transmitter with a plurality of transmitter units each emitting signal light with specific wavelengths controlled by adjusting a temperature of a semiconductor laser diode.

2. Related Background Art

Some optical transmitter applied in the wavelength division multiplexing (WDM) communication system installs a plurality of optical transmitter units each emitting signal light whose wavelength is specific to one of the signal channels in the WDM system. Such a transmitter unit often provides a Peltier device to adjust a temperature of the semiconductor laser diode (hereafter denoted as LD) in the target temperature. The United States Patents issued as U.S. Pat. No. 5,515,682 and U.S. Pat. No. 5,920,583, and Japanese Patent Application published as JP-H10-141781 have disclosed a driver circuit to control such Peltier devices. However, when the transmitter provides a plurality of TEC drivers each corresponding to one Peltier device, the size of the transmitter must be large to install all components. Moreover, as shown in the second prior art, JP-H10-335724A, an ordinary Peltier device shows a resistance of about 1Ω and has a limited current to operate it. The maximum current allowable to the ordinary Peltier device is limited from −1 A to 1 A. Accordingly, in the case that the TEC driver down converts the DC power supply of 5 V, or occasionally 3.3 V, to a voltage necessary to control the Peltier device, where the absolute value is 1 ampere in an example above, an unsatisfactory efficiency of the power conversion is available. We can not overlook this situation from a viewpoint of the low power consumption.

Noting the load efficiency of the electronic power of the transmitter, the efficiency increases as the load impedance becomes larger as shown in FIG. 4. This figure shows the efficiency of the transmitter whose configuration obeys those illustrated in the second prior art, JP-H10-141781A, as varying the load impedance. A reduced loss of the driver for the Peltier device is available for the larger load impedance, which is equivalent to the higher efficiency in the driver circuit.

SUMMARY OF THE INVENTION

A feature of the optical transmitter according to the invention is that, in an optical transmitter comprising a plurality of transmitter units each providing a Peltier device, a laser diode and a thermistor, and a driver to determine a driving current for the Peltier device; these Peltier devices are connected in series with respect to the controller. Accordingly, the load impedance viewed from the driver becomes large compared with a case where one driver independently controls one Peltier device and, accordingly, the power conversion efficiency may be enhanced. Moreover, only one driver controls a plurality of Peltier, devices, the transmitter may save a space to install components and may avoid a large sized package.

The controller may set the driving current such that a center value of the sensed temperatures becomes a target temperature, or that an average value of the sensed temperatures becomes the target temperature.

Each transmitter units may further provide a bypassing unit connected in parallel to the Peltier device, and the driver may provide a bypass control unit that controls bypassing units installed in each transmitter unit. This bypassing unit may bypass a portion of driving current flowing depending on the temperature sensed by the thermistor installed also in the same transmitter unit.

BRIEF DESCRIPTION OF THE DRAWINGS

FIG. 5 schematically illustrates a block diagram of a conventional optical transmitter that provides drivers individually corresponding to respective transmitter units.

DESCRIPTION OF THE PREFERRED EMBODIMENTS

Next, preferred embodiments according to the present invention will be described as referring to accompanying drawings.

First Embodiment

Figure 1:
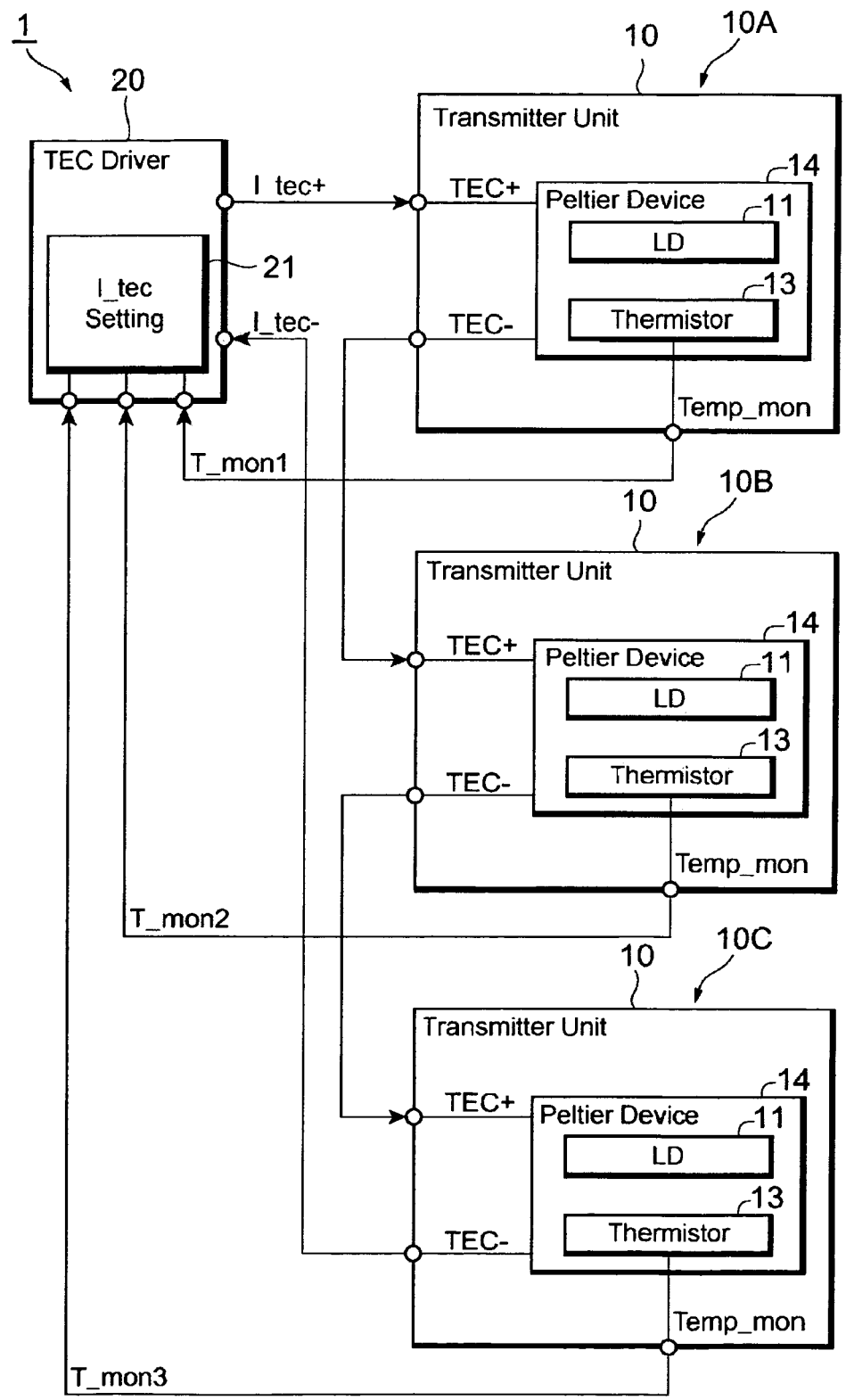
FIG. 1 schematically illustrates a block diagram of the optical transmitter according to the first embodiment of the present invention.

FIG. 1 schematically illustrates a block diagram of an optical transmitter according to the first embodiment of the invention. The optical transmitter 1, which is installed in a optical communication system for the wavelength division multiplexing (WDM) standard, comprises a plurality of transmitter units 10, three units, 10A to 10C are illustrated in FIG. 1, and a TEC driver 20. Each transmitter unit, 10A to 10C, includes a laser diode (hereafter denoted as LD) 11, a Peltier device 14 and a thermistor 13. The LD 11 emits signal light with a wavelength specific to the transmitter unit by supplying a current from an LD driver, which is not shown in FIG. 1.

The transmitter unit 10 provides a Peltier device 14 that heats up or cools down a temperature of the LD 11 by receiving a driving current from the TEC driver 20. Peltier devices 14 in each transmitter units, 10A to 10C, are connected in series with respect to the TEC driver 20. That is, one current input terminal TEC+ of the transmitter unit 10 in the first transmitter unit 10A is connected with one output terminal of the TEC driver 20 to receive the driving current I_tec+, while, the other current input terminal TEC− of the transmitter unit 10 is connected with one current input terminal TEC+ of the transmitter unit 10 in the second transmitter unit 10B. The other current input terminal TEC− of the second transmitter unit 10 is connected with one current input terminal TEC+ of the transmitter unit 10 in the third transmitter unit 10C, while, the other current input terminal TEC− of the third transmitter unit 10 is connected with the other output terminal of the TEC driver 20 to return the driving current I_tec−. Moreover, the thermistor 13 in each transmitter unit 10, which is arranged close to the LD 11 to sense the practical temperature of the LD 11, outputs the sensed signal Temp_mon to the TEC driver 20.

The TEC driver 20 controls the Peltier devices 14 in respective transmitter units, 10A to 10C. This TEC driver 20 includes a unit 21 to set the driving current, where the magnitude of the driving current supplied to the Peltier devices 14 connected in series based on the temperature sensed signal Temp_mon output from each thermistor 13. Specifically, the unit 21 sets the driving current such that, when the target temperature of the LD 11 is T0 and the maximum and the minimum values of the sensed signal are A and B, respectively, the unit 21 sets the driving current so as to satisfy the condition of (A+B)/2=T0, that is, the center value of sensed temperatures becomes the target temperature T0. The TEC driver provides thus determined driving current to the Peltier device 14. In another embodiment, the TEC driver 20 provides the driving current such that an average of sensed temperatures becomes the target temperature T0.

Figure 4:
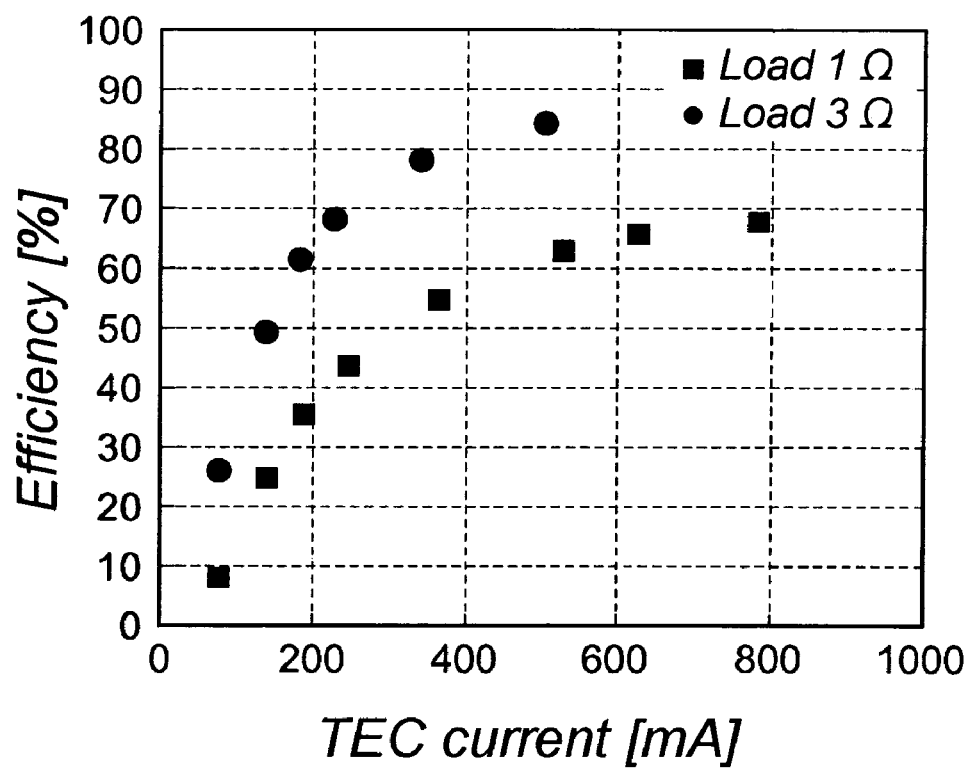
FIG. 4 compares a power conversion efficiency of two cases of the load impedance viewed from the driver.

The optical transmitter 1 of the present embodiment, because the Peltier devices 14 in respective transmitter units 10 are connected in series with respect to the TEC driver 20, a total load resistance viewed from the TEC driver becomes a substance value even when each Peltier device 14 shows a relatively small impedance. As shown in FIG. 4, the larger load impedance for the TEC driver 20 may enhance the conversion efficiency of the TEC driver 20.

Comparing the optical transmitter 1 of the present invention with a conventional transmitter shown in FIG. 5, in which each transmitter unit, 10A to 10C, accompanies with an independent TEC driver, 20A to 20C. In this case, the load impedance of each TEC driver, 20A to 20C, becomes 1Ω when the practical resistance of each Peltier device 14 is 1Ω. When each TEC driver 20A to 20C is connected with a power supply whose voltage is 5 V and the current of 1 A is necessary to control the Peltier device 14, the TEC driver 20A to 20C must provide a function equivalent to a voltage converter generating 1 V down from 5 V.

In contrast, the total load impedance of the Peltier devices 14 viewed from the TEC driver 20, where three devices are connected in series, becomes 3Ω in the transmitter 1 of the present invention. Consequently, the TEC driver 20 is necessary to have a function equivalent to generate a voltage of 3 V converting from the power supply of 5 V. Thus, the power conversion efficiency of the TEC driver 20 may be enhanced in the present invention, which enables to reduce the power consumption of the transmitter 1 even when a plurality of transmitter units, 10A to 10C, is installed. Moreover, because one TEC driver 20 controls a plurality of the Peltier devices 14, the optical transmitter 1 may avoid a large-sized scale.

Second Embodiment

Figure 2:
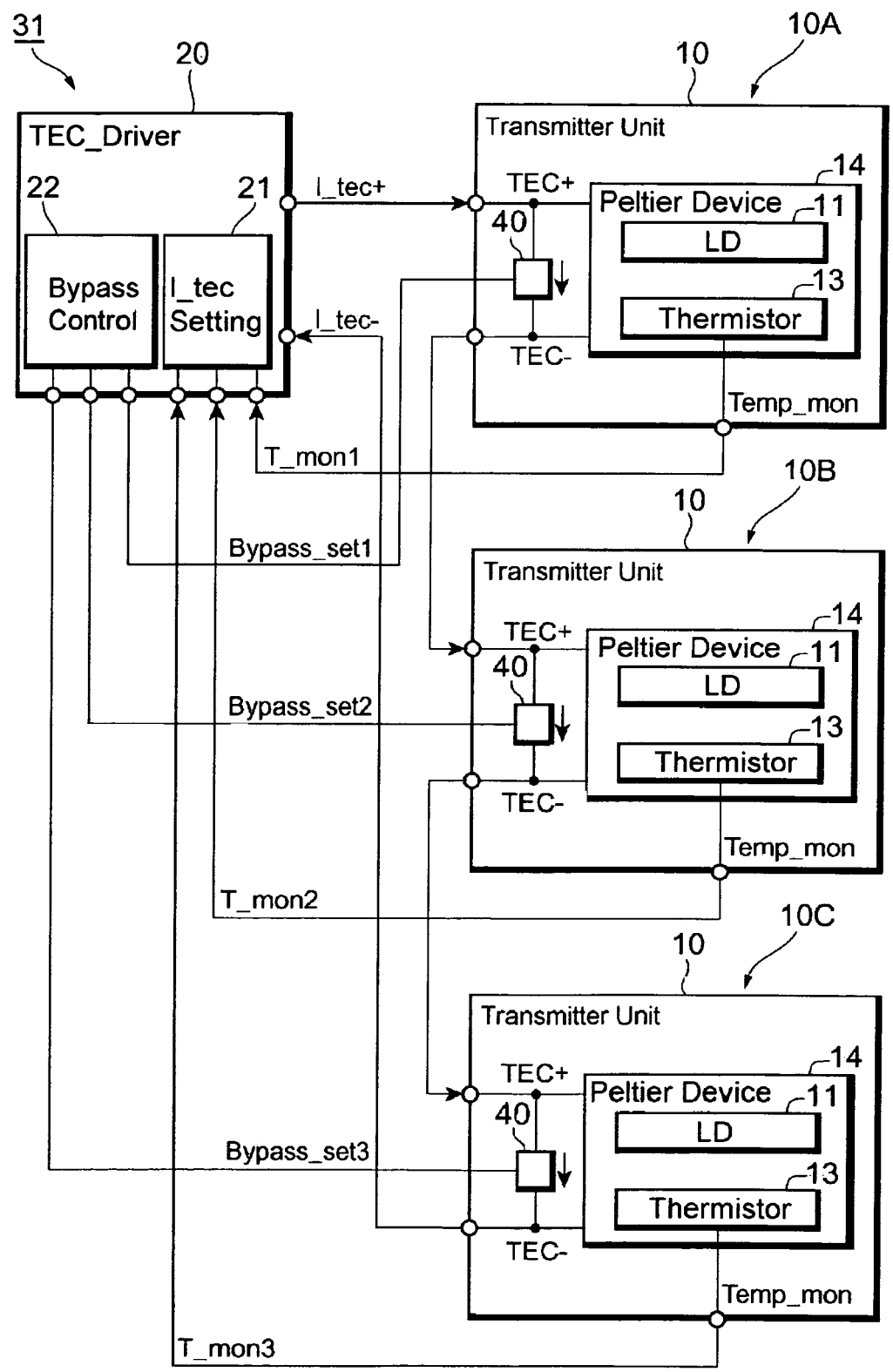
FIG. 2 schematically illustrates a block diagram of the optical transmitter according to the second embodiment of the present invention.

Next, another embodiment according to the present invention will be described. FIG. 2 schematically illustrates a block diagram of an optical transmitter 31 of the second embodiment of the invention. The optical transmitter 31 has a feature that each transmitter unit 10A to 10C provides a bypassing unit 40. That is, the bypassing unit 40 in each transmitter unit 10 is connected in parallel to the transmitter unit such that the driving current is bypassed from the Peltier device 14 in the transmitter unit 10. Moreover, the TEC driver 20 further provides a bypass control unit 22.

Figure 3:
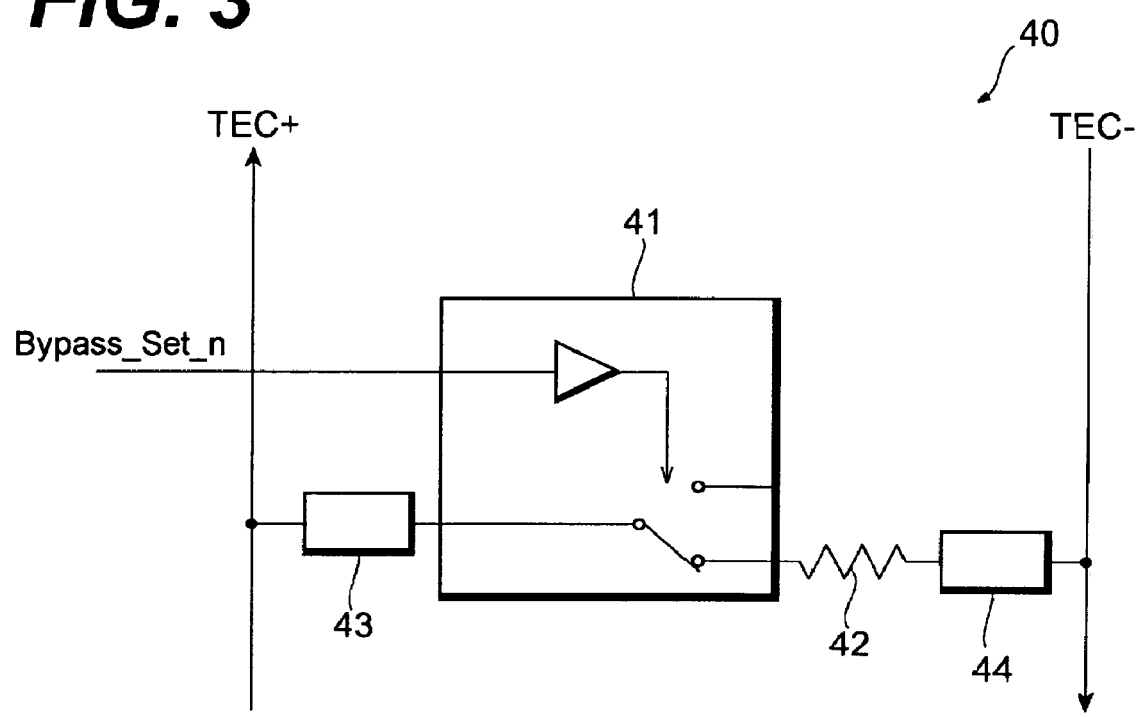
FIG. 3 is an exemplarily circuit diagram of the bypassing unit included in the transmitter unit of the second embodiment.

The bypassing unit 40, as shown in FIG. 3, provides a switching device 41, a resistive element 42, and a pair of low-passing filters, 43 and 44. The switching device 41 may be an active device, such as power MOSFET, whose conductive state is controlled by the signal, Bypass_set_n, output from the TEC driver 20. The duration of ON state of this switching device 41 may be finely adjustable by the protocol of the signal, Bypass_set_n, such as the pulse width modulation or the pulse count modulation the signal.

The resistive element 42 is connected in one side of the switching device 41 and the resistance of this resistive element is set to be about 50Ω but may be removed. The low-passing filters, 43 and 44, are connected so as to put the switching device 41 and the resistive element 42 therebetween, and these filters, 43 and 44, absorb the noise caused by the turning on or turning off of the switching device 41.

The bypass control unit 22 generates the signal Bypass_set_n that is provided to respective bypassing unit 40 based on the sensed signal Temp_mon supplied from the thermistor in respective transmitter unit 10. When a Peltier device 14 in one transmitter unit 10 is in an excess controlled state, in which the temperature of the LD in this transmitter unit 10 is off from the target temperature T0, then, the bypass control unit 22 outputs the control signal Bypass_set_n to the bypassing unit 40 of this transmitter unit 10. A portion of the driving current I_tec+ supplied from the TEC driver 20 bypasses the Peltier device 14 under controlled, and the temperature of the LD 11 may close to the target temperature T0.

In the optical transmitter 31 of the second embodiment, similar to the aforementioned transmitter 1 of the first embodiment, because the Peltier devices 14 in respective transmitter units, 10A to 10C, are connected in series, the power conversion efficiency of the TEC driver 20 may be enhanced and, consequently, the power consumption may be reduced even when the transmitter 1 installs a plurality of transmitter units each providing the Peltier device. Moreover, one TEC driver 20 may control a plural Peltier devices, the transmitter may avoid the large-sized scale.

Further, when a temperature of the LD 11 in one transmitter unit becomes off from the target temperature T0 by the excess control of the Peltier device 14, the TEC driver 20 of the second embodiment may precisely and independently adjust the temperature of this LD 11 by bypassing a portion of the current supplied to the Peltier device under controlled. Accordingly, respective LDs installed within the optical transmitter 31 may be controlled in the temperature thereof, namely, the emission wavelength of respective transmitter unit 10.

The present invention is thus described by exemplarily embodiments; however, the present invention is not restricted to those embodiments. For instance, the switching device 41 provided in the bypassing unit may be a mechanical relay switch, or in the case of the semiconductor switching device, the control signal Bypass_set_n may be a DC signal, in which the ON resistance of the switching device 41 may be adjusted by the level of this DC signal. Moreover, one of the low-passing filters, 43 and 44, may be removed.

What is claimed is:

1. An optical transmitter, comprising:
 a plurality of transmitter units each providing a Peltier device, a laser diode whose temperature is controlled by said Peltier device, and a thermistor to sense said temperature of said laser diode; and
 a driver to determine a driving current for said Peltier devices based on said temperatures sensed by said thermistors,
 wherein said Peltier devices each provided in respective transmitter units are connected in series with respect to said driver,
 wherein at least one of said optical transmitter units provides a bypassing unit connected in parallel to said Peltier device provided in said at least one of said optical transmitter units, said bypassing unit bypasses a portion of said driving current and said bypassing unit includes a switching device and a low-passing filter to eliminate a switching noise of said switching device, and wherein said driver includes a bypass control unit to control said bypassing unit provided in said at least one of said transmitter units.

2. The optical transmitter according to claim 1, wherein said driver determines said driving current such that a center value of said temperatures each sensed by said thermistor becomes a target temperature.

3. The optical transmitter according to claim 1, wherein said driver determines said driving current such that an average value of said temperatures each sensed by said thermistor becomes a target temperature.

4. An optical transmitter comprising:
a plurality of transmitter units each providing a Peltier device, a laser diode whose temperature is controlled by said Peltier device, and a thermistor to sense said temperature of said laser diode; and
a driver to determine a driving current for said Peltier devices based on said temperatures sensed by said thermistors,
wherein said Peltier devices each provided in respective transmitter units are connected in series with respect to said driver,
wherein at least one of said optical transmitter units provides a bypassing unit connected in parallel to said Peltier device provided in said at least one of said optical transmitter units, said bypassing unit bypasses a portion of said driving current,
wherein said driver includes a bypass control unit to control said bypassing unit by outputting a control signal with a protocol of a pulse width modulation or a pulse count modulation to said bypassing unit.

5. The optical transmitter according to claim 4, wherein said driver determines said driving current such that a center value of said temperatures sensed by respective thermistors becomes a target temperature.

6. The optical transmitter according to claim 4, wherein said driver determines said driving current such that an average value of said temperatures sensed by respective thermistors becomes a target temperature.

7. The optical transmitter according to claim 4, wherein said bypassing unit includes a switching device and a low-passing filter to eliminate a switching noise of said switching device.

* * * * *